United States Patent [19]
Eibner

[11] 3,986,125
[45] Oct. 12, 1976

[54] PHASE DETECTOR HAVING A 360 LINEAR RANGE FOR PERIODIC AND APERIODIC INPUT PULSE STREAMS

[75] Inventor: Jules A. Eibner, Maple Glen, Pa.

[73] Assignee: Sperry Univac Corporation, New York, N.Y.

[22] Filed: Oct. 31, 1975

[21] Appl. No.: 627,576

[52] U.S. Cl. .................................. 328/62; 328/109; 328/133; 328/55; 328/155
[51] Int. Cl.[2] .......................................... H03K 3/02
[58] Field of Search ............. 328/109, 110, 133, 62, 328/55, 134, 155

[56] References Cited
UNITED STATES PATENTS

| | | | |
|---|---|---|---|
| 3,393,367 | 7/1968 | Vallee | 328/62 |
| 3,619,793 | 11/1971 | Broome | 328/155 |
| 3,634,869 | 1/1972 | Hsueh | 328/110 X |
| 3,798,556 | 3/1974 | Ooya et al. | 328/133 |
| 3,922,610 | 11/1975 | Buchan et al. | 328/109 |

*Primary Examiner*—John S. Heyman
*Attorney, Agent, or Firm*—Eugene T. Battjer; Sheldon Kapustin

[57] ABSTRACT

A phase detector comprising three bistable flops and a NAND gate interconnected to respond to a data input pulse stream and a controlled square wave clock pulse stream to provide, in response to each data pulse, a reference pulse having a width equal to one-half the clock pulse period and a variable pulse having a nominal width equal to that of the reference pulse and a proportionately greater or lesser width according to the direction and amount of displacement of the data pulse from the center of the clock period in which it occurs.

12 Claims, 7 Drawing Figures

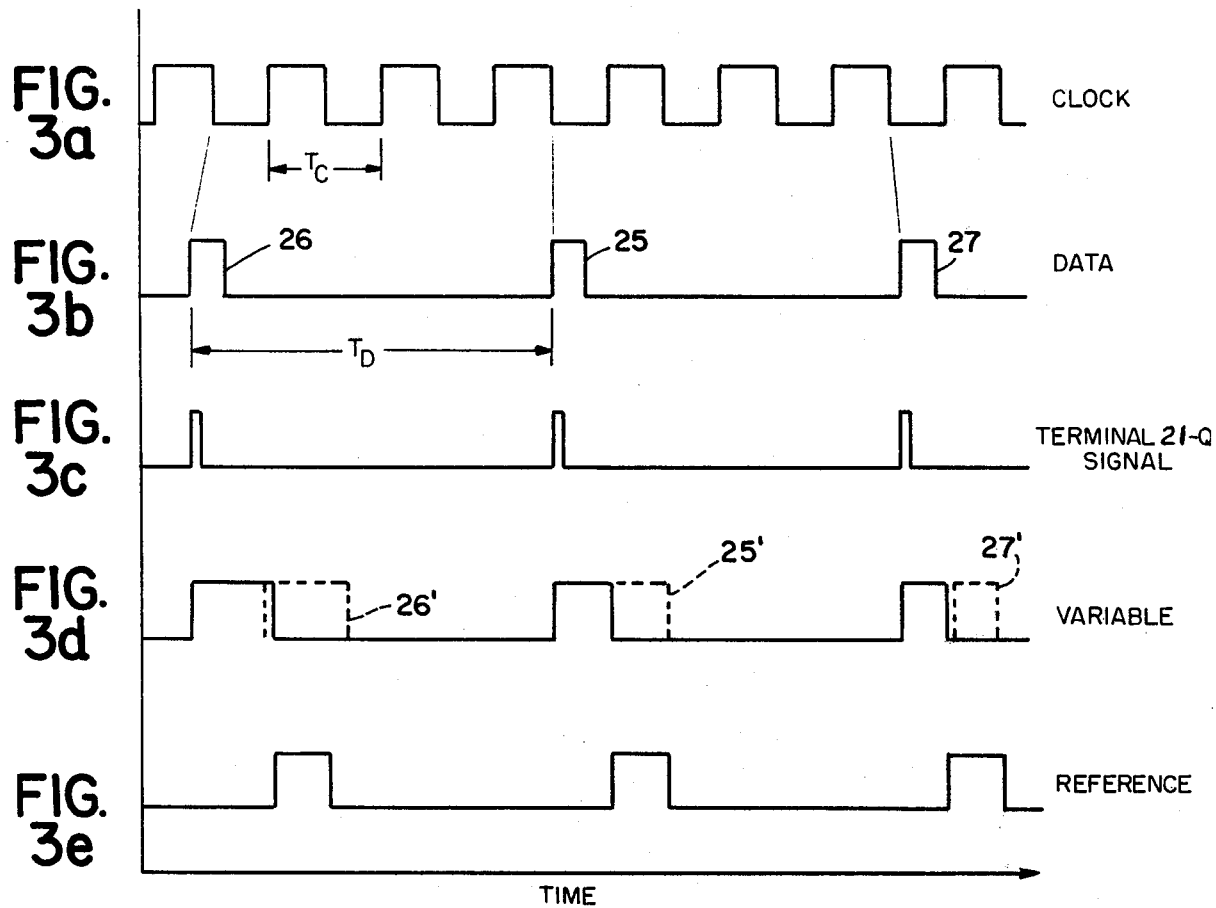

PHASE DETECTOR HAVING A 360 LINEAR RANGE FOR PERIODIC AND APERIODIC INPUT PULSE STREAMS

BACKGROUND OF THE INVENTION

1. Field of the Invention

This invention relates generally to phase detectors and more particularly to a new and improved analog phase detector comprising digital circuit components and referred to herein as a hybrid phase detector.

2. Description of the Prior Art

Phase detectors which comprise digital components and operate in analog fashion are well known in the present state of the art and are now commonly used for many applications in place of conventional analog phase detectors which are usually considerably more complicated. These hybrid devices are also generally preferred over purely digital phase detector circuits where high accuracy is required at extremely high data rates, for instance, on the order of 25 megacycles or greater. A digital phase detector operating at these frequencies requires a pulse source capable of providing pulses at a frequency at least an order of magnitude greater than the data rate to achieve suitable accuracy. Such pulse sources are not readily available. As will be appreciated, therefore, hybrid phase detectors have been of particular interest in the data processing field for use, for example, in phase locked loops employed in data recording and recovery apparatus.

A phase locked loop typically includes a voltage controlled oscillator controlled to oscillate at a frequency which is an integral multiple of the frequency of the digital data that is to be recovered, for instance, from a magnetic recording medium such as a disc or tape. The voltage controlled oscillator serves to provide a feedback signal which is phase compared with the input digital data signal. Generally, the phase locked loop is designed to operate in a high gain, wide bandwidth mode to achieve rapid lock-on to the input data. Once lock-on is achieved, the loop bandwidth is reduced to avoid response to spurious high frequency signals while maintaining lock-on to long term frequency drift of the input data. For this purpose, it is highly desirable that the phase detector incorporated in the phase locked loop have a linear operating range extending over essentially a full cycle of the clock pulse signals provided by the voltage controlled oscillator.

Another desired operating requirement of a phase locked loop employed in data processing systems is that it be able to maintain lock-on not only for periodic input data as characterized by conventional frequency modulation and phase modulation data but also for aperiodic data which is exemplified by well known codes such as non-return to zero (NRZ) and modified frequency modulation (MFM). Some hybrid phase detectors heretofore available in the art are capable of providing a linear operating range extending over 360° of the voltage controlled clock pulse period but only in response to periodic input data. Others can operate on aperiodic data but have a linear range of only 180°, but in any event operation cannot be achieved over 360° in response to both periodic and aperiodic input data.

SUMMARY OF THE INVENTION

The present invention overcomes the linear operating range and aperiodic data response limitation of the prior art by the provision of a novel phase detector comprising three identical bistable flip flops and a NAND gate. An input data pulse stream is applied to a first of the three flip flops, and a controlled square wave clock signal derived, for example, from a voltage controlled oscillator is applied directly to a second flip flop and through the NAND gate to the third flip flop. Upon receiving an input data pulse, the first flip flop is clocked to set the second flip flop which initiates a variable width pulse and resets the first flip flop in readiness for the next data input pulse. At the beginning of the next cycle of the clock signal following the input pulse the second flip flop is clocked to terminate the variable width pulse obtained therefrom and the third flip flop is clocked to initiate a reference pulse. A half cycle of the clock pulse later the third flip flop is reset to terminate the reference pulse. Thus, the reference pulse has a width or duration equal to one-half the clock period.

For the case where the leading edge of the input data pulse occurs at the center of the clock cycle the duration of the variable width pulse is also equal to one-half the clock period. When the input data pulse occurs before the center of the clock cycle, the width of the variable pulse exceeds that of the reference pulse in proportion to the displacement of the data pulse from the center of the clock cycle. When the input data pulse occurs after the center of the clock cycle, the width of the variable pulse becomes less than that of the reference pulse again in proportion to the displacement of the data pulse from the center of the clock cycle.

The relative widths of the reference and variable pulse control the frequency of a voltage controlled oscillator, from which the square wave clock pulse signal is obtained, in a manner to keep the center of the clock cycles coincident with the leading edge of the input data pulses. Linear control of the oscillator is maintained over essentially the full 360° of the clock cycle. Moreover, since generation of both the reference and variable pulses is dependent on response to an input data pulse, the circuit provides such linear operation for both periodic and aperiodic input data.

BRIEF DESCRIPTION OF THE DRAWINGS

FIGS. 3a to 3e depict various waveforms which are useful in explaining the operation of the phase detector and phase locked oscillator.

DESCRIPTION OF THE PREFERRED EMBODIMENT

Figure 1:
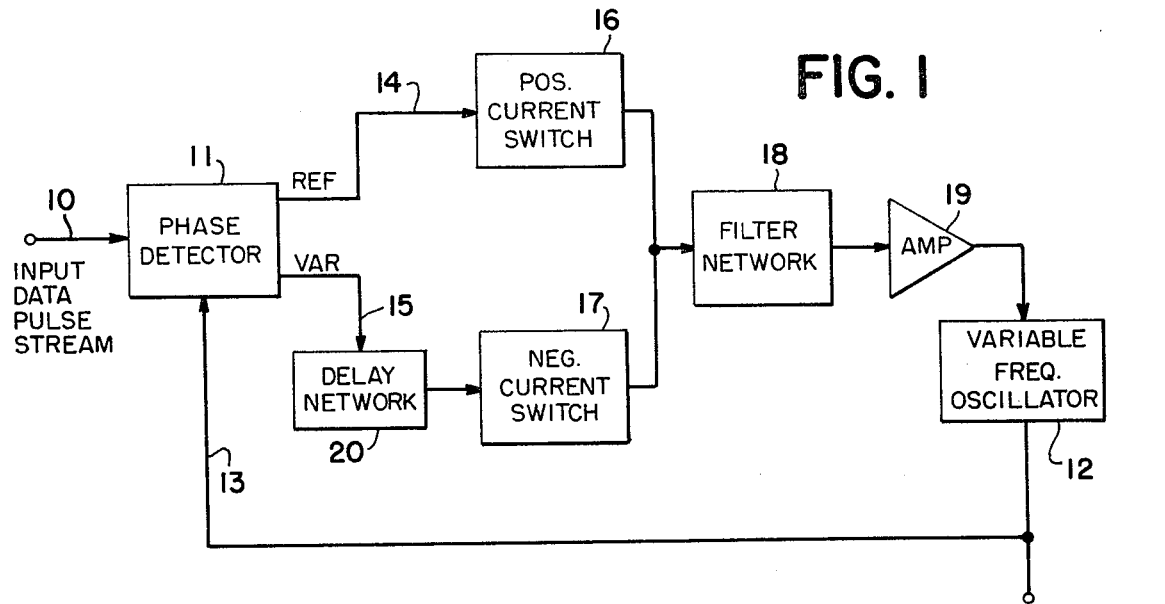
FIG. 1 is a block diagram of a phase locked oscillator incorporating the novel phase detector of the present invention.

As mentioned hereinbefore, the instant phase detector invention is particularly useful in a phase locked oscillator of a digital data recovery system. The invention will therefore be described with reference to a phase locked loop as illustrated in FIG. 1 where an input data pulse stream representative of data to be recovered is applied through lead 10 as an input signal to phase detector 11. A controlled square wave clock output signal, that is, a signal having equal high and low segments in each period, is also supplied to the phase detector as a feedback signal from voltage controlled oscillator 12 by way of lead 13. The input data pulse stream has a fundamental period $T_D$ as illustrated in FIG. 3b. The clock signal has a period $T_C$ as indicated in FIG. 3a and its frequency is controlled to be an integral multiple of the frequency corresponding to the fundamental period of the clock signal.

Phase comparator 10 compares the time occurrence of the leading edge of a data pulse with the center of the clock period in which the data pulse occurs and provides reference (FIG. 3e) and variable (FIG. 3d) output pulses on leads 14 and 15 to positive and negative current switches 16 and 17, respectively. The current switches in turn provide signals through filter network 18 and amplifier 19 to control the frequency of oscillator 12. The function of delay network 20 will be described subsequently and can be disregarded at this point. The reference pulse provided at the phase detector output has a width equal to one-half the width of the clock period. For the case where a data pulse occurs at the center of a clock period, the variable pulse provided at the phase detector output also has a width equal to one-half the clock period and thus is equal to the width of the reference pulse. Under these conditions the control voltage supplied to the oscillator is such that the oscillator frequency remains unchanged. On the other hand, for the condition where the data pulse occurs before or after the center of the clock period, the width of the variable pulse provided by the phase detector is respectively greater and less than the width of the reference pulse. This difference in width between the reference and variable pulses causes the frequency to the oscillator to be varied so that the center of the clock periods move into coincidence with the leading edge of the data pulses. More specifically, when a data pulse occurs before the center of the clock period, the width of the variable pulse increases in proportion to the displacement of the data pulse from the center of the clock period. Since the positive and negative current switches 16, 17 supply current to filter 18 in proportion to the widths of the reference and variable pulses, the greater width of the latter changes the nominal output voltage of the filter to cause an appropriate increase in the oscillator frequency. Likewise, when a data pulse occurs after the center of the clock period, the width of the variable pulse decreases and the resultant difference in width between the reference and variable pulses causes an appropriate decrease of the oscillator frequency.

Figure 2:
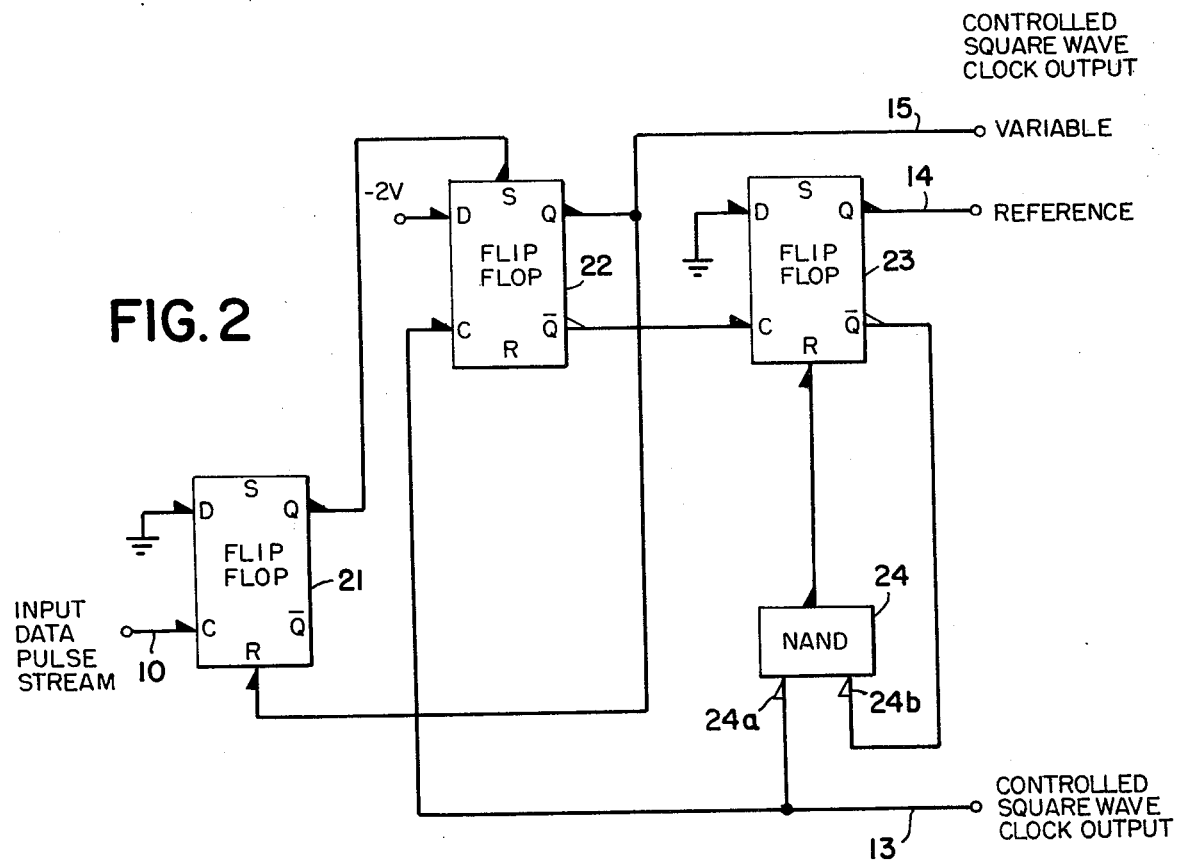
FIG. 2 is a logic diagram of the phase detector used in the phase locked oscillator of FIG. 1.

The manner in which the phase detector 11 of FIG. 1 functions as explained in the preceding paragraph will now be more fully described with reference to FIGS. 2 and 3. FIG. 2 is a logic diagram of the phase detector. Flip flops 21, 22 and 23 are initially set with the voltages low at terminals 21-Q, 22-Q and 23-Q. The flip flops used are Motorola models 10131 commonly referred to as D flip flops which operate such that the voltage level at the D terminal is transferred to the Q terminal when a positive going signal edge is applied to the clock terminal in the absence of a simultaneous positive signal applied to the set (S) or reset (R) terminal. A −2V signal applied to a D terminal functions in the circuit as a low level signal while ground functions as a high level signal. An input data pulse supplied on lead 10 is applied to the clock (C) terminal of flip flop 21 driving the signal at terminal 21-Q high as indicated in FIG. 3c. The high level signal at terminal 21-Q simultaneously sets flip flop 22 driving the signal at terminal 22-Q high to produce the variable pulse as shown in FIG. 3d and reset flip flop 21 so the signal at terminal 21-Q returns to a low level.

At the occurrence of the leading edge of the clock pulse immediately following the clock cycle in which the variable pulse was initiated, the clock signal on lead 13 connected to the clock terminal of flip flop 22 acts to drive the signal at terminal 22-Q low thereby terminating the variable pulse, as a consequence of the low level −2V signal on terminal 22-D, whereupon the signal at terminal 22-$\overline{Q}$ simultaneously goes high and clocks flip flop 23 causing the signal at terminal 23-Q to go high and produce the reference pulse as shown in FIG. 3e.

On the next transition of the clock pulse, that is, from a high level to a low level in the illustrative waveform, the signal on lead 13 goes low thereby providing a low level signal at input terminal 24a of NAND gate 24 simultaneously with a low level signal applied to NAND gate terminal 24b from terminal 23-$\overline{Q}$, whereupon flip flop 23 is reset and the signal at terminal 23-Q changes to a low level thereby terminating the reference pulse. It will be noted that the reference pulse thus produced at terminal 23-Q has a width equal to one-half the clock period $T_C$. In the case of data pulse 25 which occurs at the center of a clock period, the variable pulse width is also equal to one-half the clock period $T_C$ or in other words, equal to the width of the reference pulse. Since the positive current switch 16 and negative current switch 17 of FIG. 1 each operate to provide current to filter 18 in proportion to the width of the pulse applied to the respective current switch, the resultant current supplied to the filter is zero when the reference and variable pulses are of equal width. Therefore, the filter output voltage remains at its nominal value and the frequency of variable frequency oscillator 12 is not changed.

In the case of data pulse 26 for which the leading edge thereof occurs before the center of the clock period, the width of the variable pulse is greater than the width of the reference pulse. As a result, negative current switch 17 supplies more current to filter 18 than is supplied thereto by positive current switch 16. Hence, the filter output voltage changes from its nominal value in a direction to increase the frequency of variable frequency oscillation and move the center of the clock period into coincidence with the leading edge of the data pulse. Conversely, when the leading edge of a data pulse occurs after the center of the clock period, as indicated by data pulse 27, the reference pulse width is greater than the variable pulse width and more current is supplied to the filter by positive current switch 16 than by negative current switch 17. Consequently, the filter output voltage changes from its nominal value in a manner to decrease the frequency of voltage controlled oscillator so once again the center of the clock periods move into coincidence with the leading edges of the data pulses.

The delay network 20 included in the variable pulse line between phase detector 11 and negative current switch 17 serves to delay the variable pulse an amount sufficient to move it into overlapping relation with the refernce pulse. The delay is such that for a data pulse 25, which occurs at the center of a clock period, the resultant equal width reference and variable pulses are coincident in time at the input of the positive and negative current switches 16, 17. The delayed variable pulse produced in response to data pulse 25 is represented by dashed line pulse 25'. The variable pulses produced in response to data pulses 26 and 27 are delayed so as to occur as indicated by respective dashed line reference pulses 26' and 27'. The overlap of the reference and variable pulses provided by delay network 20 improves the accuracy of the phase locked loop inasmuch as no time is allowed for deterioration of the filter 18 output signal produced in response to the variable pulse prior to occurrence of the reference pulse.

The foregoing description of the operation of the phase detector has been made with reference to a periodic input data pulse stream for which an input pulse occurs in every fourth cycle of the clock signal. Since the variable and reference pulses are produced only in response to an input data pulse, it will be appreciated that the phase detector will also operate satisfactorily for aperiodic data pulse streams such as modified frequency modulation (MFM) data where the fundamental or minimum spacing between input pulses is T (corresponding to $T_D$ of FIG. 3b) and the input pulses may also be spaced by 1.5T or 2T. It should also be noted that the phase detector will operate satisfactorily where the fundamental period $T_D$ of the input data pulse stream is equal to the clock pulse period $T_C$, that is, where the minimum spacing between data pulses is such that successive data pulses can occur in immediately succeeding clock periods. In such instance, if a delay network 20 is not included in the phase locked loop, the leading portion of a variable pulse of greater width than the reference pulse will overlap the trailing portion of the reference pulse associated with the immediately preceding input data pulse, but this will not materially affect the operation of the phase locked loop.

While the invention has been described with reference to a specific embodiment, it will be apparent that improvements and modifications may be made within the purview of the invention without departing from the true spirit and scope thereof as defined in the appended claims.

I claim:

1. A phase detector responsive to an input pulse stream and a square wave clock signal for producing in response to each input pulse a reference pulse having a duration substantially equal to one-half the clock pulse period and a variable pulse having a duration which is greater or less than the reference pulse duration in accordance with the direction and amount of time displacement of the input pulse from the center of the clock pulse cycle in which said input pulse occurs, said phase detector comprising:
    means responsive to an input pulse occurring in one cycle of the clock pulse signal for initiating a variable pulse,
    means responsive to the leading edge of the clock pulse occurring in the next cycle of the clock pulse signal for terminating the variable pulse and initiating a reference pulse, and
    means responsive to the transition of the clock pulse immediately following said leading edge for terminating the reference pulse.

2. The phase detector of claim 1 in combination with delay means coupled to receive and delay the variable pulse to place it in overlapping time relation with the reference pulse.

3. The phase detector of claim 1 in combination with delay means coupled to receive and delay the variable pulse one-half the clock pulse period.

4. The phase detector of claim 1 wherein the input pulse responsive means comprises bistable switch means which switches from a first state to a second state in response to the imput pulse to initiate the variable pulse.

5. The phase detector of claim 4 wherein the clock pulse leading edge responsive means comprises:
    said bistable switch means which switches back to the first state in response to the clock pulse leading edge to terminate the variable pulse, and
    additional bistable switch means which switches from a first state to a second state in response to the occurrence of the clock pulse leading edge to initiate the reference pulse.

6. The phase detector of claim 5 wherein the clock pulse transition responsive means comprises said additional bistable switch means which switches back to the first state in response to the clock pulse transition to terminate the reference pulse.

7. The phase detector of claim 6 in combination with delay means coupled to receive and delay the variable pulse to place it in overlapping time relation with the reference pulse.

8. The phase detector of claim 1 wherein the input pulse responsive means comprises first and second bistable flip flops coupled such that said first bistable flip flop responds to the input pulse to switch from an initial state to a second state in which it acts to switch the second bistable flip flop from an initial state to a second state to produce the variable pulse which functions to switch said first flip flop back to its initial state.

9. The phase detector of claim 8 wherein the clock pulse leading edge responsive means comprises:
    said second bistable flip flop which is coupled to receive the clock pulse and respond to the clock pulse leading edge to switch from the second state back to the initial state to terminate the variable pulse, and
    a third bistable flip flop coupled to said second bistable flip flop to switch from an initial state to a second state to produce the reference pulse upon termination of the variable pulse.

10. The phase detector of claim 9 wherein the clock pulse transition responsive means comprises said third bistable flip flop coupled to respond to the clock pulse transition to switch from the second state back to its initial state to terminate the reference pulse.

11. The phase detector of claim 10 in combination with delay means coupled to receive and delay the variable pulse an amount equal to one-half the clock pulse period.

12. A phase detector responsive to an input pulse stream and a square wave clock pulse signal for producing both a reference pulse and a variable pulse only in response to each input pulse, and phase detector comprising:
    means responsive to an input pulse occurring in one cycle of the clock pulse signal for initiating a variable pulse,
    means responsive to the leading edge of the clock pulse occurring at the next cycle of the clock pulse signal after initiation of the variable pulse for terminating the variable pulse whereby said variable pulse has a duration in accordance with the direction and magnitude of time displacement of the input pulse from the center of the clock pulse cycle in which said input pulse occurs, and
    means responsive to the clock pulse signal after occurrence of the input pulse for generating a reference pulse having a duration substantially equal to one-half the clock pulse period.

* * * * *